United States Patent
Shin et al.

(10) Patent No.: US 10,498,318 B1
(45) Date of Patent: Dec. 3, 2019

(54) ELECTRICAL CIRCUITS AND METHODS TO CORRECT DUTY CYCLE ERROR

(71) Applicant: Xilinx, Inc., San Jose, CA (US)

(72) Inventors: Jaewook Shin, San Jose, CA (US); Didem Z. Turker Melek, San Jose, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/228,631

(22) Filed: Dec. 20, 2018

(51) Int. Cl.
| | |
|---|---|
| *H03K 3/017* | (2006.01) |
| *H03K 5/04* | (2006.01) |
| *H03K 7/08* | (2006.01) |
| *H03K 5/156* | (2006.01) |
| *H03K 19/20* | (2006.01) |

(52) U.S. Cl.
CPC .......... *H03K 5/1565* (2013.01); *H03K 19/20* (2013.01)

(58) Field of Classification Search
CPC ........ H03K 5/1565; H03K 7/08; H03K 3/017; H03K 5/151; H03L 7/0812
USPC .......................................... 327/175, 291–299
See application file for complete search history.

(56) References Cited

U.S. PATENT DOCUMENTS

| | | | |
|---|---|---|---|
| 5,572,159 A | | 11/1996 | McFarland |
| 5,963,071 A | * | 10/1999 | Dowlatabadi ...... H03K 5/00006 327/116 |
| 6,593,789 B2 | | 7/2003 | Atallah et al. |
| 6,603,337 B2 | | 8/2003 | Cho |
| 7,062,692 B1 | | 6/2006 | Lesea |
| 7,839,195 B1 | * | 11/2010 | Feng ...................... H03K 5/156 327/147 |
| 9,602,082 B2 | | 3/2017 | Hedayati et al. |
| 2005/0285649 A1 | * | 12/2005 | Chun ................... H03K 5/1565 327/172 |
| 2007/0159224 A1 | | 7/2007 | Dwarka et al. |
| 2009/0128206 A1 | * | 5/2009 | Boerstler ............... H03K 3/017 327/175 |

OTHER PUBLICATIONS

Agarwal, K. et. al., "A Duty-Cycle Correction Circuit for High-Frequency Clocks", IEEE 2006 Symposium on VLSI Circuits Digest of Technical Papers, Jun. 17, 2006, 2 pages, IBM, Austin, TX USA.
Galton, Ian, "Delta-Sigma Fractional-N Phase-Locked Loops", 2017, 11 pgs.

(Continued)

*Primary Examiner* — Anh Q Tra

(57) ABSTRACT

Electrical circuits and associated methods relate to duty cycle correction having a voltage controlled delay line VCDL controlled by an analog voltage and a digital command signal to generate a $VCDL_{out}$ signal. In an illustrative example, the analog voltage may be generated by an analog circuit, the analog circuit may include a reference voltage, a low-pass filter, an amplifier and a loop filter. In an illustrative example, the analog circuit may be controlled by an analog command signal. The analog command signal may be programmable applied on the analog circuit to produce the analog voltage. The digital command signal may be programmable to select desired delay band in the VCDL. The analog voltage and the digital command signal may be applied to the VCDL together to obtain a desired duty cycle.

20 Claims, 7 Drawing Sheets

(56) References Cited

OTHER PUBLICATIONS

Huh, H. et. al., "Comparison frequency doubling and charge pump matching techniques for dual-band ΔΣ fractional-N frequency synthesizer", IEEE Journal of Solid-State Circuits, vol. 40, No. 11, Nov. 2005, 2228-2236.

Yoo, C. et. al., "Open-loop Full-Digital Duty Cycle Correction Circuit", Electronics Letters May 26, 2005 vol. 41 No. 11, 2 pages.

\* cited by examiner

ELECTRICAL CIRCUITS AND METHODS TO CORRECT DUTY CYCLE ERROR

TECHNICAL FIELD

Various embodiments relate generally to duty cycle correction.

BACKGROUND

Modern networks are responsible for interconnecting computing devices operable to exchange data. Data may be exchanged from circuit to circuit on a common circuit board or from circuit board to circuit board along a common backplane, for example, in a computer or server. In some implementations, data may be exchanged over long distances, for example, from a travel agent's computer to an airline server on a cloud network.

Data can be transferred in the form of bits and bytes over a digital or analog media. Data transmit and receive systems enable digital or analog communications and its movement between devices. Analog data transfer typically sends data in the form of analog signals, while digital data transfer converts data into digital bit streams. An analog signal is one which a parameter (e.g., amplitude, phase) that varies smoothly. Video and audio transmissions are often transferred or recorded using analog signals. Digital signals must have a finite set of possible values (e.g. binary on/off).

A phase-locked loop (PLL) is a frequency control circuit that generates an output signal whose phase is related to the phase of an input signal. A frequency oscillator and a phase detector in a feedback loop are often used to form a PLL. Performance parameters about a PLL may include, for example, hold-in range, pull-in range, lock-in range, and loop bandwidth. A duty cycle is the percentage of time a signal is active. It may be determined from the ratio between a pulse duration and the period of a rectangular waveform.

SUMMARY

Electrical circuits and associated methods relate to duty cycle correction in response to a combination of both analog and digital control signals. In an illustrative example, a voltage controlled delay line generates an output signal to change the duty cycle error in response to an analog voltage and a digital command signal. For example, the digital command signal may be applied to the voltage controlled delay line to select a desired range of delay and the analog voltage may be generated by an analog circuit under control of an analog command signal. The analog circuit may detect the duty cycle error, and a digital circuit may correct the duty cycle error. With a combination of an analog controlled fine tuning and a digital controlled coarse tuning, a duty cycle error may be corrected or controlled to a commanded value.

Various embodiments may achieve one or more advantages. For example, some embodiments may enable output clock signal to have a desired duty cycle, for example, 50% duty cycle, to achieve a low-jitter clock signal that could be used in, for example, a frequency doubler.

In one exemplary aspect, an electrical circuit includes a low-pass filter (LPF) receiving an output clock signal from a logic circuit. The electrical circuit also includes an amplifier configured to generate a first analog signal in response to an analog command signal and an output signal from the LPF and a loop filter configured to generate a second analog signal in response to the first analog signal from the amplifier. A reset logic circuit is configured to generate a final reset signal to reset the logic circuit in response to an external reset signal and an output $VCDL_{out}$ signal of a voltage controlled delay line VCDL. The VCDL is configured to generate the $VCDL_{out}$ signal in response to the second analog signal and a digital command signal.

In some embodiments, after resetting the logic circuit, a duty cycle of the output clock signal may become about 50%. In some embodiments, the VCDL may be configured to select a delay range in response to a digital command signal. In some embodiments, the VCDL may be further configured to adjust an amount of delay to correct a duty cycle error of the output clock signal in response to the analog command signal.

In some embodiments, the VCDL may also include a series of cascaded stages, each stage includes a series of delay buffers. Each delay buffer may include a PMOS transistor and a NMOS transistor arranged as a CMOS inverter, an NMOS transistor electrically connected with the NMOS transistor in series, and a series of digital controlled delay bands coupled to an output of the CMOS inverter. The NMOS transistor may be configured to present a controllable resistance in response to the second analog signal. Each delay buffer may also include an NMOS transistor in parallel with the NMOS transistor, and the NMOS transistor may be coupled to a high input voltage $V_{dd}$. In some embodiments, each delay band may include several slices configured in parallel and each slice may be configured to be selectively enabled in response to the digital command signal.

In some embodiments, the reset logic may include at least one inverter configured to invert and delay the $VCDL_{out}$ signal, a first NAND gate configured to generate an internal reset signal in response to the $VCDL_{out}$ signal and the inverted and delayed $VCDL_{out}$ γ signal. In some embodiments, the reset logic may also include a second inverter configured to invert the external reset signal, and a second NAND gate configured to generate the final reset signal in response to the internal reset signal and the inverted external reset signal. In some embodiments, the logic circuit may be a D-type flip flop, and the amplifier may be an operational transconductance amplifier OTA.

In another exemplary aspect, a method to correct duty cycle error includes sending an output clock signal from a logic circuit to a low-pass filter (LPF) and a voltage-controlled delay line (VCDL). The method also includes generating a first analog signal in response to an analog command signal and an output signal from the LPF. The method also includes transferring the first analog signal into a second analog signal through a loop filter. The method also includes generating an output $VCDL_{out}$ signal by the VCDL in response to the second analog signal and a digital command signal. The method also includes generating a final reset signal resetting the logic circuit in response to an external reset signal and the $VCDL_{out}$ signal.

In some embodiments, after resetting the logic circuit, a duty cycle of the output clock signal may become about 50%. In some embodiments, the VCDL may be configured to select a delay range in response to a digital command signal. The VCDL may also be further configured to adjust an amount of delay to correct a duty cycle error of the output clock signal in response to the analog command signal. In some embodiments, the VCDL may include a series of cascaded stages, each stage may include several delay buffers. Each delay buffer may include a PMOS transistor and an NMOS transistor arranged as a CMOS inverter, an NMOS transistor connected with the NMOS transistor in series, and a series of controlled delay bands coupled to an output of the CMOS inverter. The NMOS transistor may be configured to present a controllable resistance in response to the second analog signal. In some embodiments, each delay buffer may also include an NMOS transistor in parallel with the NMOS transistor, and the NMOS transistor may be coupled to a high input voltage $V_{dd}$. In some embodiments, each delay band may include several slices configured in parallel and each slice may be configured to be selectively enabled in response to the digital command signal.

In some embodiments, the final reset signal may be generated by a reset logic circuit. The reset logic circuit may include an inverter configured to invert the $VCDL_{out}$ signal and a first NAND gate may be configured to generate an output signal in response to the $VCDL_{out}$ signal and the inverted $VCDL_{out}$ signal. The reset logic circuit may also include a second inverter configured to generate the external reset signal and a second NAND gate configured to generate the reset final signal in response to the first NAND gate output signal and the inverted external reset signal. In some embodiments, the logic circuit may include a D-type flip flop.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is organized as follows. First, an exemplary programmable integrated circuit (IC) on which the disclosed circuits and processes may be implemented is briefly introduced with reference to FIG. 1. Second, with reference to FIGS. 2-5, the discussion turns to exemplary embodiments that illustrate duty cycle correction. Specifically, an exemplary electrical circuit and corresponding method may be used to correct a duty cycle error. Finally, with reference to FIGS. 6-7, further explanatory electrical circuits are presented to explain applications of the duty cycle correction circuit.

Figure 1:
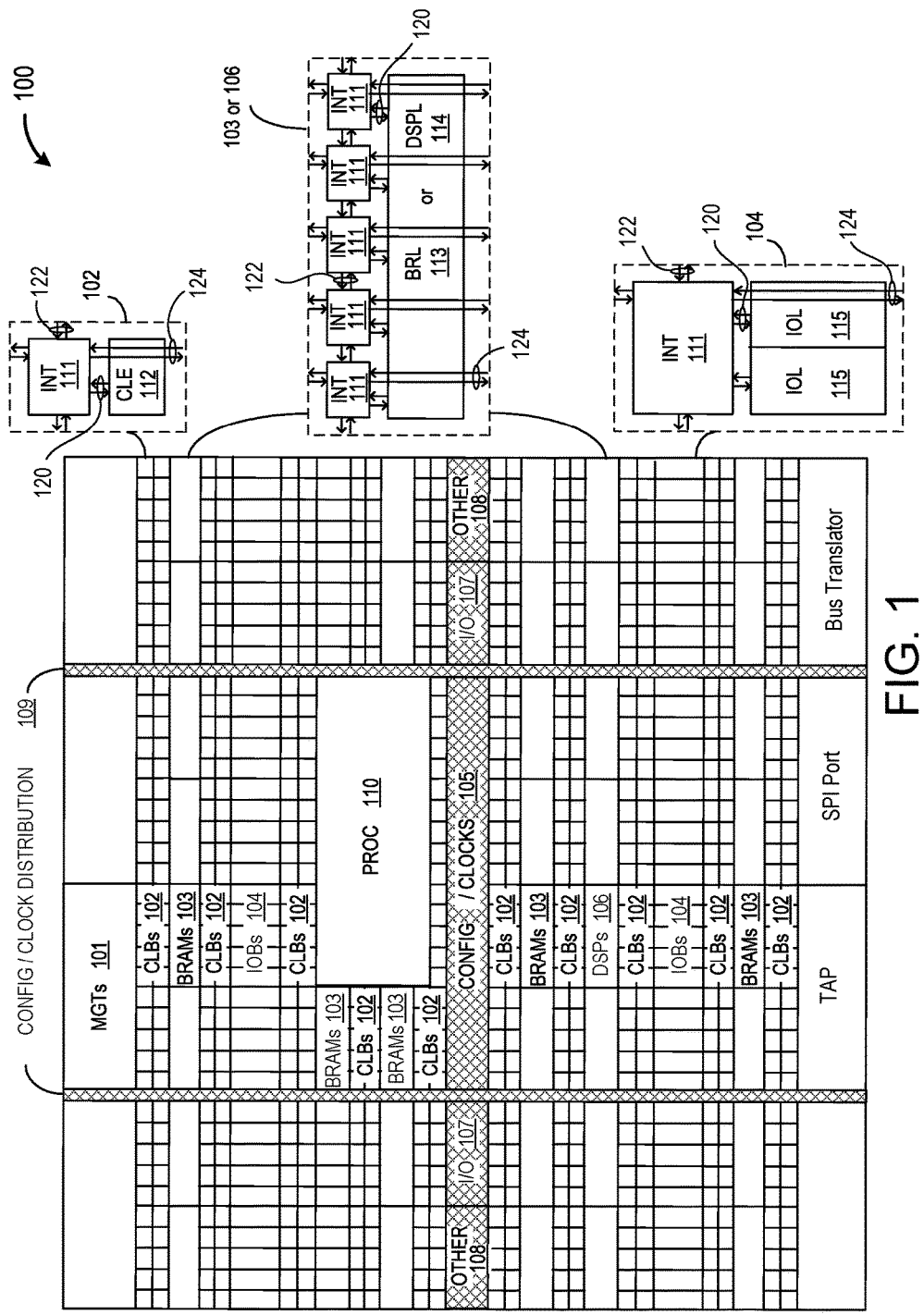
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

In various examples, a PLL may be used in MGTs to generate an output signal whose phase is related to the phase of an input signal. Duty cycle of a clock signal could be distorted for many reasons, or an input clock itself may have a distorted duty cycle. In some embodiments, specific duty cycles may be needed, for example, duty cycle of 50%, for robust (e.g., low jitter) operation. Therefore, a duty cycle correction circuit may be used to obtain a desired duty cycle.

Figure 2:
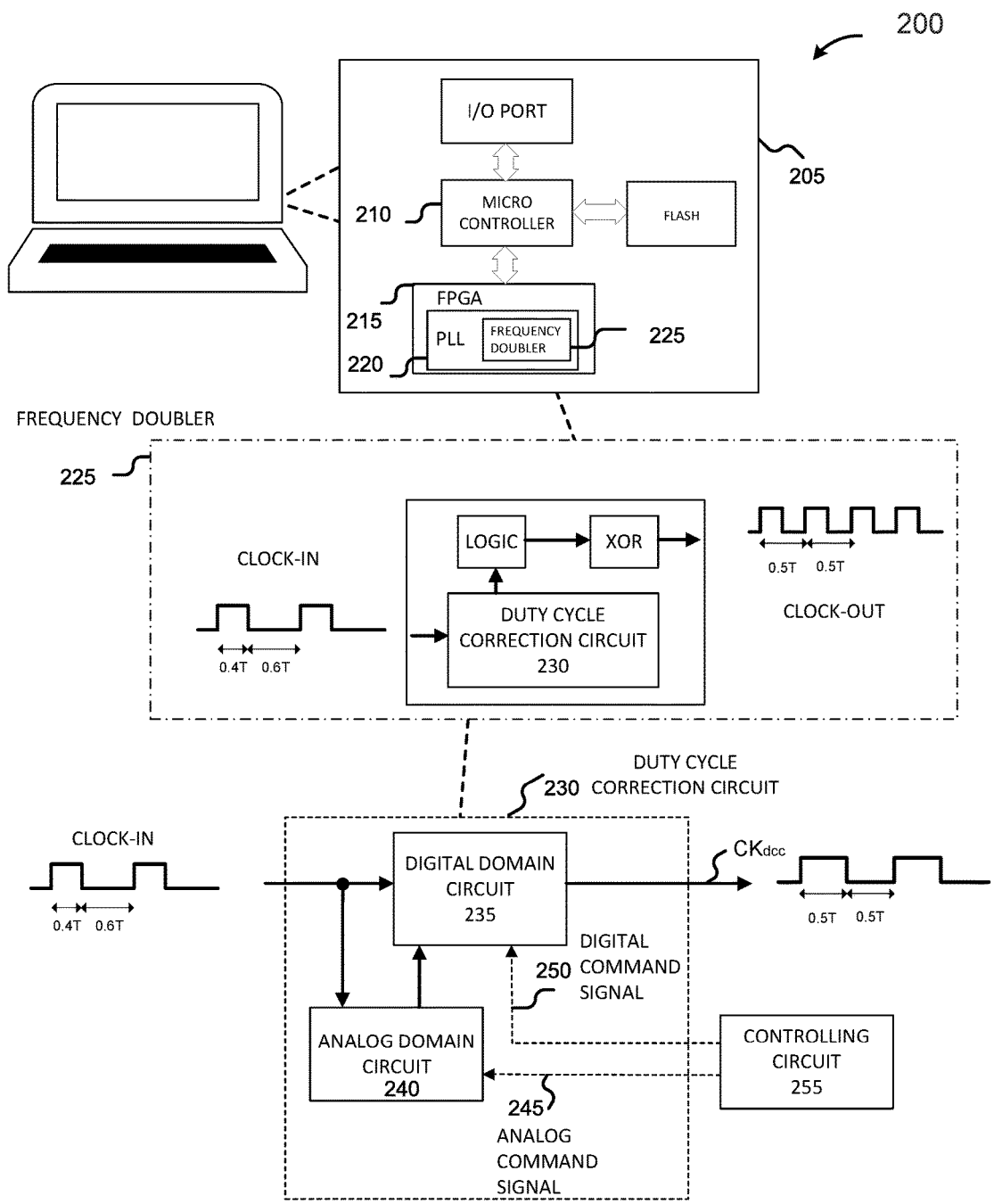
FIG. 2 depicts an exemplary duty cycle correction circuit (DCCC) implemented in a high-speed digital computing system.
Figure 3:
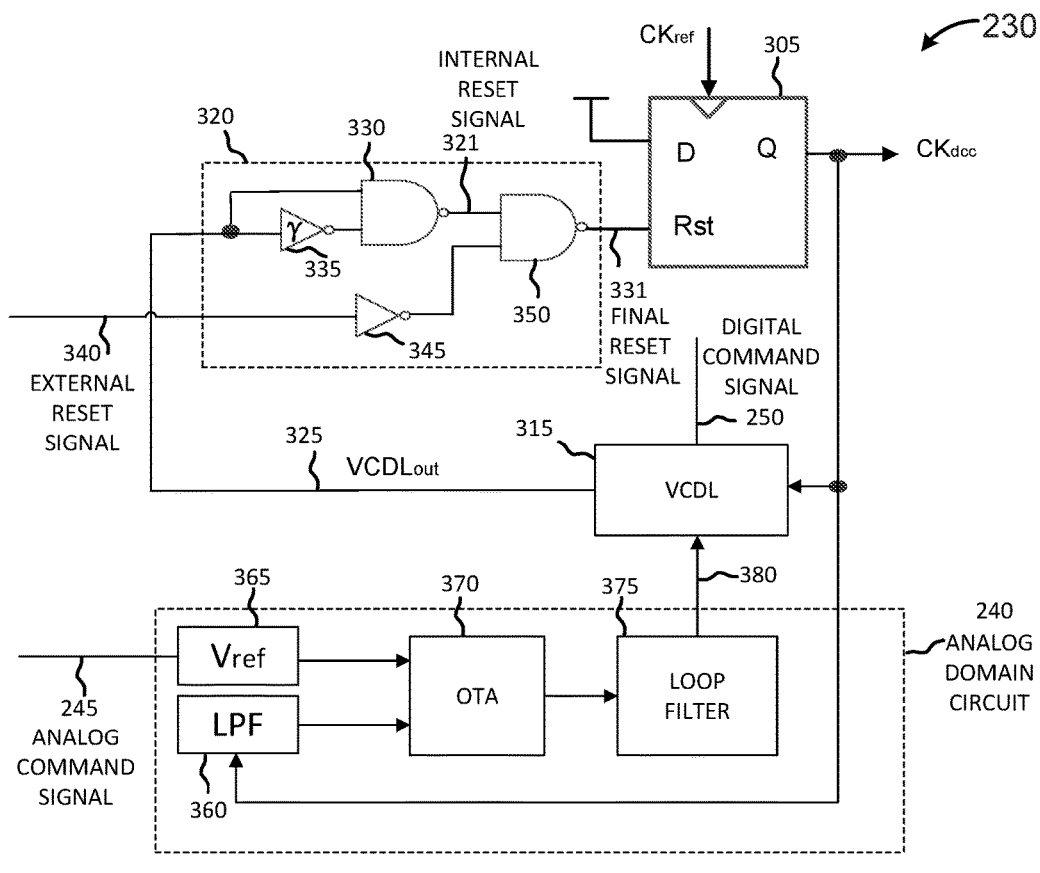
FIG. 3(A) depicts a schematic view of an exemplary duty cycle correction circuit (DCCC).
FIG. 3(B) shows an exemplary time diagram illustrating operation of the DCCC of FIG. 3(A).
Figure 3:
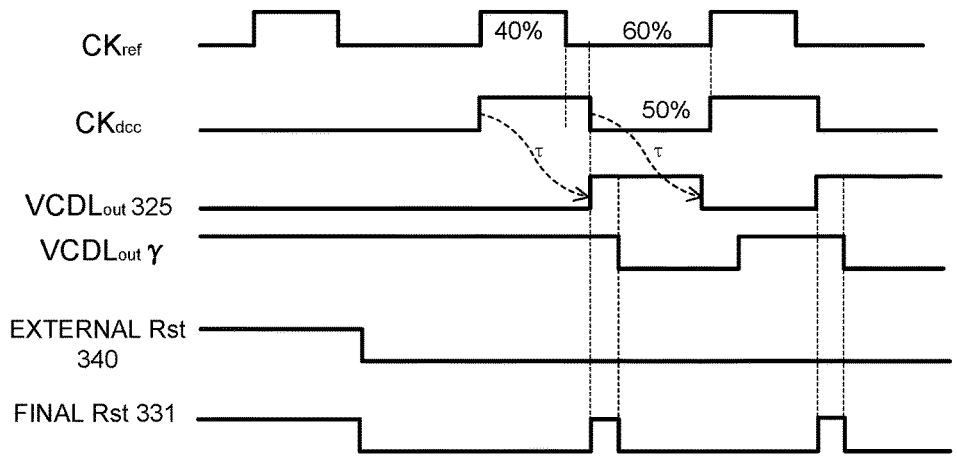

FIG. 2 depicts an exemplary duty cycle correction circuit (DCCC) implemented in a high-speed digital computing system. A high-speed digital computing system 200 includes a system 205. The system 205 includes multiple interconnected circuit subsystems, one of which is a microcontroller 210 electrically connected with a FPGA 215. The FPGA 215, which may include many high-speed data transmission lines, may provide a PLL (phase-locked loop) 220 to generate desired clock signals needed during data transfer. The PLL 220 of the depicted example includes a frequency doubler 225 which may be used to generate clock signals with different frequency relationships. An example of a PLL architecture is described in further detail with reference to FIG. 7.

To build the frequency doubler 225 that has low jitter, a duty cycle correction circuit (DCCC) 230 may advantageously decrease the jitter and correct a duty cycle error (e.g., asymmetry) of an output clock signal. The duty cycle correction circuit (DCCC) 230 includes a digital domain circuit 235 and an analog domain circuit 240. A controlling circuit 255 may be configured to control the duty cycle correction circuit 230 (DCCC) by sending an analog command signal 245 to the analog domain circuit 240 and sending a digital command signal 250 to the digital domain circuit 235. After being processed by the duty cycle correction circuit (DCCC) 230, the duty cycle of a $CK_{dcc}$ signal may be adjusted to a desired duty cycle, for example, 50%, regardless of the duty cycle of the input signal CLOCK_IN.

FIG. 3(A) depicts a schematic view of an exemplary duty cycle correction circuit (DCCC). In this illustrated example, a duty cycle correction circuit (DCCC), which may be an embodiment of the duty cycle correction circuit 230 of FIG. 2, includes a logic circuit 305 fed by an input clock signal $CK_{ref}$ (e.g., the CLOCK_IN signal in FIG. 2) to correct duty cycle of the input clock signal $CK_{ref}$ and to generate an output clock signal $CK_{dcc}$ (e.g., the $CK_{dcc}$ signal in FIG. 2). In some embodiments, the logic circuit may be, for example, a D-type flip flop. The output clock signal $CK_{dcc}$ is supplied to an input of a voltage controlled delay line VCDL 315. The VCDL 315 is controlled by a digital command signal 250 to select a delay range that covers required delay to correct duty cycle distortion of the input clock signal $CK_{ref}$.

The duty cycle correction circuit 230 also includes an analog domain circuit 240. The analog domain circuit 240 also receives the output clock signal $CK_{dcc}$ and detects a duty cycle error of the output clock signal $CK_{dcc}$ and generates an analog voltage 380 that is needed by the VCDL 315 to produce the right amount of delay to correct the duty cycle error. More specifically, the analog domain circuit 240 includes a low-pass filter LPF 360, an amplifier 370, and a loop filter 375. In some embodiments, the amplifier 370 may be an operational transconductance amplifier OTA 370. The LPF 360 is electrically configured to the logic circuit 305 to receive the output clock signal $CK_{dcc}$. The LPF 360 is a duty cycle measuring circuit whose output voltage is subtracted in the amplifier 370 (e.g., OTA 370) from a reference voltage 365. The reference voltage 365 is controlled and could be adjusted in response to an analog command signal 245. The amplifier 370 (e.g., OTA 370) generates a current that is proportional to the difference of its input voltages. If two voltages are equal, then no current will charge or discharge the loop filter 375. Otherwise, the loop filter 375 may be charged or discharged to change the duty cycle of the output clock signal $CK_{dcc}$ in response to the duty cycle error. The loop filter 375 is electrically coupled to the output of the OTA 370 to generate the analog voltage 380. In some embodiments, the loop filter 375 may be a capacitor. The analog voltage 380 is then applied to the VCDL 315 to correct the duty cycle error of the output clock signal $CK_{dcc}$.

The duty cycle correction circuit 230 further includes a reset logic circuit 320 to generate a final reset signal 331 resetting the logic circuit 305. The reset logic circuit 320 is controlled by an external reset signal 340 and output of the VCDL 315, that is, $VCDL_{out}$ signal 325.

In some embodiments, the reset logic circuit 320 may include two inverters 335, 345 and two NAND gates 330, 350. A first inverter 335 may invert the $VCDL_{out}$ signal 325 and may also introduce a delay γ on the $VCDL_{out}$ signal 325 to form an inverted delayed $VCDL_{out}$ γ signal. The inverted delayed $VCDL_{out}$ γ signal may be received by a first NAND gate 330. The first NAND gate 330 may also directly receive the $VCDL_{out}$ signal 325. In response to its two inputs, the first NAND gate 330 may generate an internal reset signal 321. A second inverter 345 may invert the external reset signal 340 and send its output to a second NAND gate 350. The second NAND gate 350 may generate the final reset signal 331, e.g., a short pulse which has a pulse width γ, in response to the first NAND gate 330 output and the inverted external reset signal.

An example of a VCDL architecture is described in further detail with reference to FIG. 4.

FIG. 3(B) shows an exemplary time diagram illustrating operation of the DCCC of FIG. 3(A). The external reset signal 340 is set to a high state to initialize the FF 305 and then set to a low state for normal operation. The input clock signal $CK_{ref}$ with an errored duty cycle feeds into the D-type FF. When a rising edge of the $CK_{ref}$ appears, the output clock signal $CK_{dcc}$ would be high until the next rising edge of the final reset signal 331 appears. The VCDL 315 controlled by the digital command signal 250 and the analog voltage 380 will generate the $VCDL_{out}$ signal 325 with an optimal delay τ on the output clock signal $CK_{dcc}$ to create the final reset signal 331 at an optimal time position. Therefore, duty cycle error of the output clock signal $CK_{dcc}$ may be corrected.

The first inverter 335 generates the $VCDL_{out}$ γ signal. The reset logic circuit 320 is configured to generate the final reset signal 331 to the FF 305 after some logic gates in response to the $VCDL_{out}$ signal 325, the $VCDL_{out}$ γ signal and the external reset signal 340. Setting the external reset signal 340 to low, the second NAND gate 350 would function like an inverter. When the rising edge of the final reset signal 331 appears, the output clock signal $CK_{dcc}$ will be pulled down from high to low. Therefore, an output clock signal $CK_{dcc}$ with unchanged frequency and corrected duty cycle is obtained.

Figure 4:
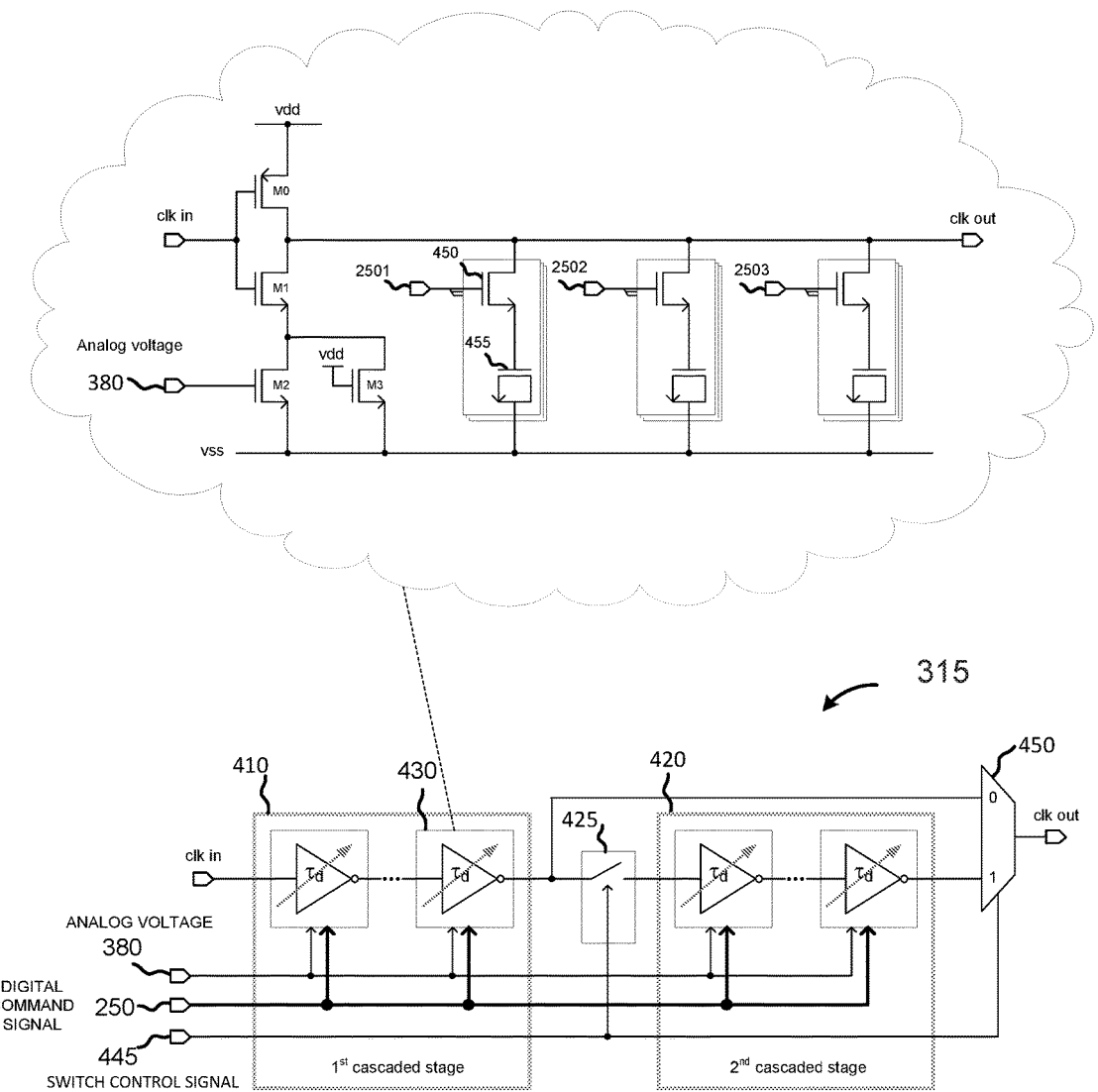
FIG. 4 depicts a schematic view of an exemplary cascaded VCDL architecture and a VCDL unit delay buffer.

FIG. 4 depicts a schematic view of an exemplary VCDL architecture and a VCDL unit delay buffer. A VCDL architecture could be achieved by many different implementations. Based on the consideration of noise, a cascaded stage VCDL architecture 315 is selected to extend frequency range. In this depicted example, the VCDL 315 includes a first cascaded stage 410, a second cascaded stage 420, and a switch 425 is configured between these two cascaded stages 410, 420. In each stage, several delay buffers 430 are electrically connected in series. The digital command signal 250 fed to each delay buffer 430 of these two cascaded stages is controlled to select a delay range of the VCDL. The delay range is predetermined to cover the input frequency of $CK_{ref}$ signal. Extended delay range is achieved by control the switch and a 2-to-1 multiplexer 450. An output of the first cascaded stage 410 and an output of the first and the second cascaded stage 410/420 are received by the multiplexer 450. In this depicted example, a switch control signal 445 controls the switch 425 and the multiplexer 450. In some embodiments, the switch and the multiplexer 450 may also be controlled by the digital command signal 250. After a delay range is selected, the analog voltage 380 generated by the analog domain circuit 240 precisely adjusts amount of delay of the VCDL to correct the duty cycle error of the input clock signal $CK_{ref}$.

An exemplary structure of a delay buffer is also disclosed. The delay buffer 430 includes a PMOS transistor M0 and an NMOS transistor M1 in a standard CMOS inverter. An NMOS transistor M2 is electrically connected with the NMOS transistor M1 in series. Several parallel delay bands are connected to the CMOS inverter output. The NMOS transistor M2 is controlled by the analog voltage 380 formed by the analog domain circuit 240 in FIG. 3. In some embodiments, the NMOS transistor M2 may be configured to present a controllable resistance in response to the second analog voltage 380. To guarantee continuous operation of the duty cycle correction circuit, an NMOS transistor M3 connects with the transistor M2 in parallel is coupled to a high input voltage $V_{dd}$.

In some embodiments, the delay buffer 430 includes several parallel delay bands, e.g., three parallel delay bands, coupled to the CMOS inverter. Every delay band includes an NMOS transistor 450 and a transistor controlled capacitor 455. The first delay band is controlled by a first digital command signal 2501, a second delay band is controlled by a second digital command signal 2502 and a third delay band is controlled by a third digital command signal 2503. In some embodiments, every delay band may include several slices, and its digital command signal could be programmed and configured to select desired slices.

Figure 5:
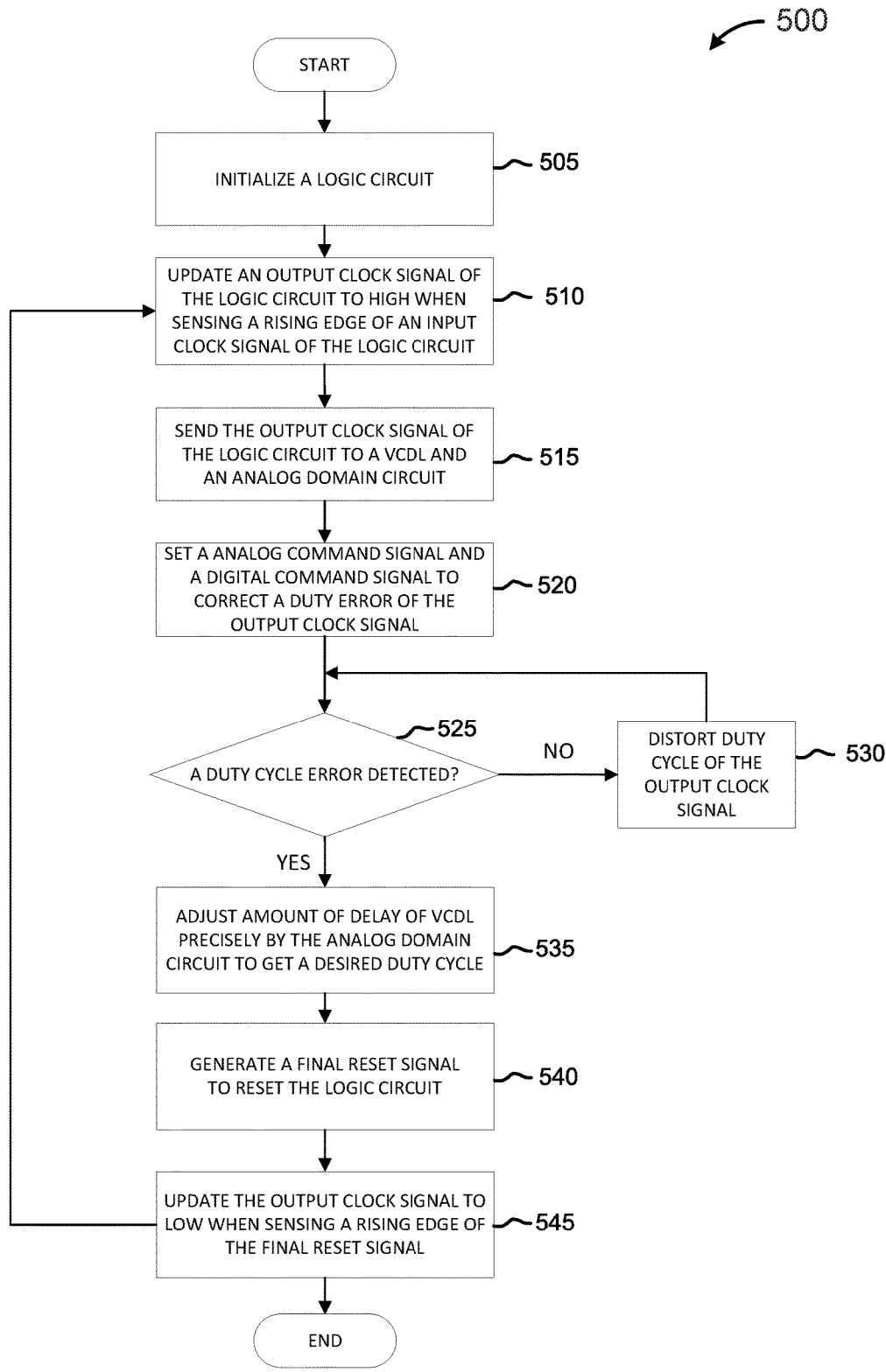
FIG. 5 depicts a flowchart of an exemplary duty cycle correction method.

FIG. 5 depicts a flowchart of an exemplary duty cycle correction method. In method 500, a logic circuit is provided. In step 505, the logic circuit is initialized, and an input clock signal $CK_{ref}$ is fed to the logic circuit to generate an output clock signal $CK_{dcc}$. In step 510, the output clock signal $CK_{dcc}$ is changed to high state when sensing a rising edge of the input clock signal $CK_{ref}$. In some embodiments, the logic circuit may be a D-type FF. An external reset signal (e.g., the external reset signal 340) may be applied to the logic circuit for the initialization. In step 515, the output clock signal $CK_{dcc}$ is then sent to a voltage-controlled delay line circuit (VCDL) and an analog domain circuit. In step 520, a digital command signal and an analog signal are set to correct a duty cycle error of the output clock signal. In some embodiments, the digital command signal (e.g., the digital command signal 250 in FIG. 3) may be applied to the VCDL and an analog command signal (e.g., the analog command signal 245 in FIG. 3) may be applied to an analog domain circuit (e.g., the analog domain circuit 240 in FIG. 3) to adjust a duty cycle error of the input clock signal $CK_{ref}$. In step 525, when a duty cycle error is detected, the VCDL is precisely controlled to adjust an amount of delay to get a desired duty cycle in step 535. In some embodiments, the digital command signal may select a delay range that covers the input frequency of $CK_{ref}$. The analog command signal (e.g., the analog command signal 245 in FIG. 2) may control an analog input (e.g., the analog voltage 380 in FIG. 3) of the VCDL to set a desired duty cycle at the output $CK_{dcc}$. In some embodiments, the desired duty cycle may be 50%. More specifically, after the delay range is selected, a low-pass filter (e.g., the low-pass filter 360) may be used to detect duty cycle of the output clock signal $CK_{dcc}$. The reference voltage and the low-pass filter output are processed together by an OTA (e.g., the OTA 370 in FIG. 3) to generate a current. The generated current may then change the status of a loop filter (e.g., the loop filter 375) to generate the desired analog voltage 380. This desired analog voltage 380 may be obtained by adjusting the reference voltage 365 and the current. After being processed by the VCDL 315 and being processed by a reset logic circuit (e.g., the reset logic 320), in step 540, a final reset signal (e.g., the final reset signal 331) is generated to change the waveform of the output clock signal (e.g., the output clock signal $CK_{dcc}$). In step 545, the output clock signal $CK_{dcc}$ is then updated from high to low when sensing a rising edge of the final reset signal. Therefore, an output clock signal $CK_{dcc}$ with a desired duty cycle is obtained.

When duty cycle of the input signal (e.g., the $CK_{ref}$ signal in FIG. 3) is the same as a desired duty cycle (e.g., 50%) that is set by the analog command signal, in step 530, the duty cycle of the output clock signal is distorted. In some embodiments, the analog loop may first distort duty cycle at $CK_{dcc}$ because VCDL delay is preferably set to the minimum at the beginning of operation. Eventually, duty cycle of the output signal (e.g., the $CK_{dcc}$ signal in FIG. 3) will be corrected by the analog domain circuit (e.g., the analog domain circuit 245 in FIG. 3).

Figure 6:
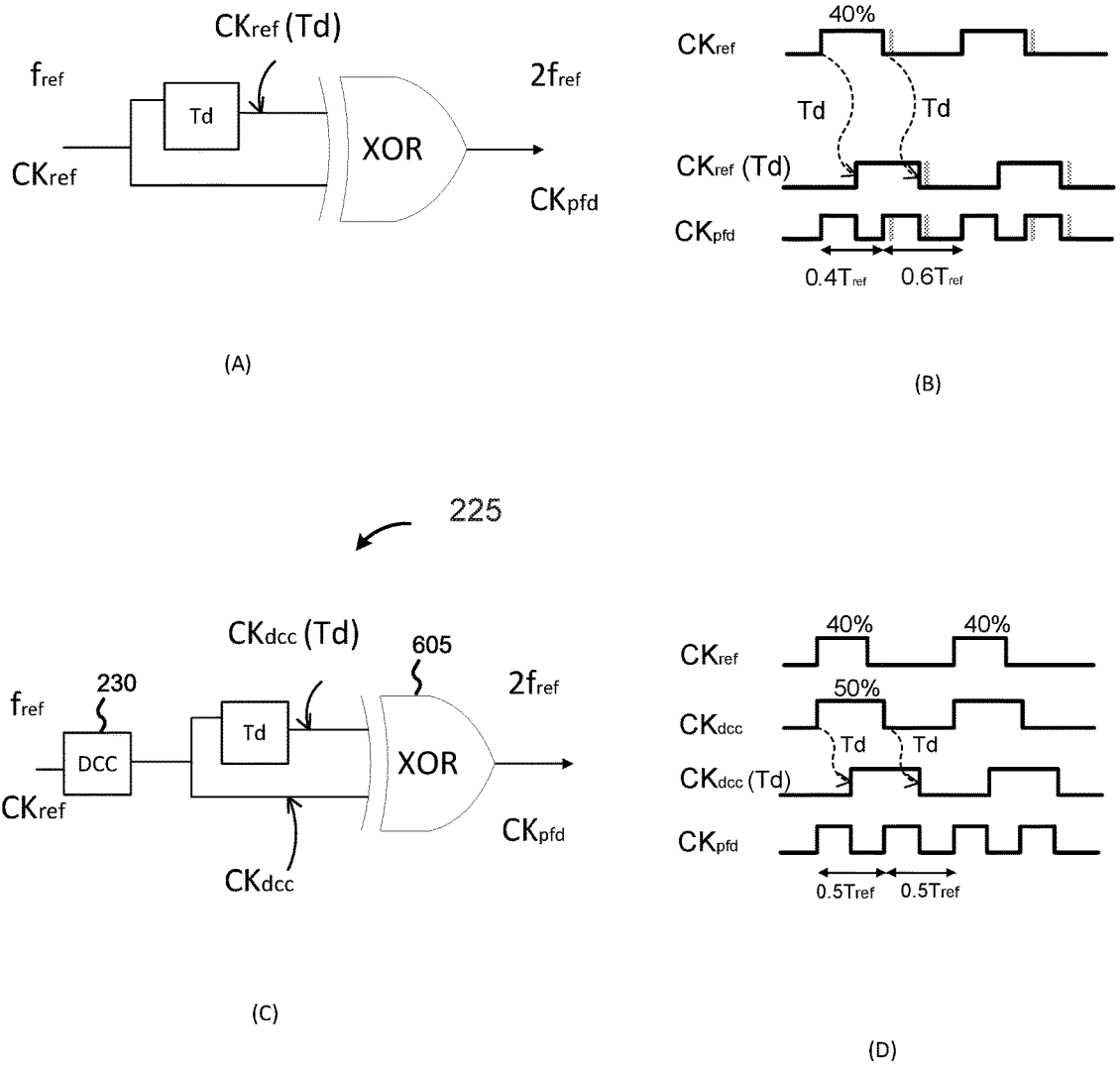
FIG. 6 depicts a schematic view of an exemplary frequency doubler with and without the duty cycle correction circuit and corresponding time diagrams.

FIG. 6 depicts a schematic view of an exemplary frequency doubler with and without use of the duty cycle correction circuit and corresponding time diagrams. FIG. 6(A) is an exemplary frequency doubler without a duty cycle correction circuit. For example, the duty cycle of the input clock signal is 40%, and after being doubled by the frequency doubler, more jitter appears, as shown in FIG. 6(B). FIG. 6(C) is an exemplary frequency doubler (e.g., the frequency doubler 225) with a duty cycle correction circuit (e.g., the DCC 230) used. The duty cycle of the input clock signal is corrected to 50% before the input clock signal is received by an XOR gate 605, so little jitter exists in the output clock signal.

Figure 7:
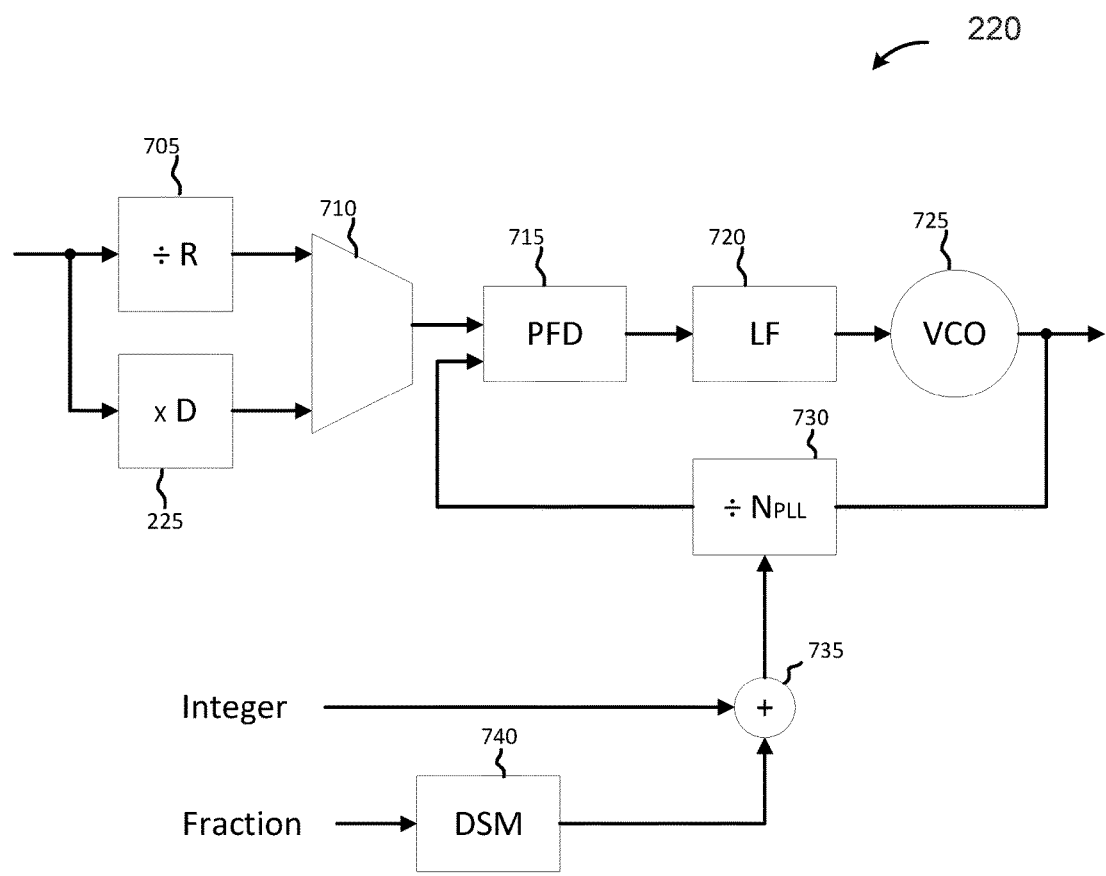
FIG. 7 depicts a schematic view of an exemplary delta-sigma fractional-N PLL comprising the frequency doubler shown in FIG. 6.

FIG. 7 depicts a schematic view of an exemplary delta-sigma fractional-N PLL comprising the frequency doubler shown in FIG. 6. In various embodiments, the delta-sigma fractional-N PLL may operate with a frequency doubler to improve PLL random phase noise as there may be a trade-off in the PLL output noise, for example, between voltage-controlled oscillator (VCO) noise and delta-sigma modulated (DSM) noise by PLL loop-bandwidth. In an illustrative example application circuit depicted in FIG. 7, the PLL 220 is a delta-sigma fractional-N PLL. The PLL 220 includes an input divider 705 and the frequency doubler 225, both of which are configured to receive a reference clock signal and generate clock signals with various frequencies to be selected by a multiplexer 710. The PLL 220 also includes a phase-frequency detector (PFD) 715, a low-pass filter (LF) 720, a voltage-controlled oscillator (VCO) 725 and an N-fold digital divider 730. The PFD 715 compares positive-going edges of the clock signal by the multiplexer 710 to those from the N-fold digital divider 730 and drives the LF 720 with current pulses whose widths are proportional to the phase difference between the two signals. The pulses are low-pass filtered by the LF 720 and the resulting waveform drives the VCO 725. The PLL 220 also includes a summing junction 735. The summing junction 735 receives a fractional divided value through a delta-sigma modulator (DSM) 740 and an integer value to generate a digital control signal that may determine bit shifting operation of the N-fold digital divider 730.

By using a frequency doubler (e.g., the frequency doubler 225) that implements the duty cycle correction circuit (e.g., the DCC 230), a delta-sigma fractional-N PLL 220 may generate a low period jitter clock signal.

Although various embodiments have been described with reference to the figures, other embodiments are possible. For example, the duty cycle correction circuit could be used in a frequency divider. A frequency divider could be used inside or outside a delay-locked loop (DLL) or PLL circuit. The DLL circuit or the PLL circuit could be used inside or outside an application specific integrated circuit (ASIC) or a field programmable gate array (FPGA).

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments may be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example and not limitation, both general and special purpose microprocessors, which may include a single processor or one of multiple processors of any kind of computer. Generally, a processor will receive instructions and data from a read-only memory or a random-access memory or both. The essential elements of a computer are a processor for executing instructions and one or more memories for storing instructions and data. Storage devices suitable for tangibly embodying computer program instructions and data include all forms of non-volatile memory, including, by way of example, semiconductor memory devices, such as EPROM, EEPROM, and flash memory devices. The processor and the memory can be supplemented by, or incorporated in, ASICs (application-specific integrated circuits). In some embodiments, the processor and the member can be supplemented by, or incorporated in hardware programmable devices, such as FPGAs, for example.

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In various embodiments, a computer system may include non-transitory memory. The memory may be connected to the one or more processors may be configured for encoding data and computer readable instructions, including processor executable program instructions. The data and computer readable instructions may be accessible to the one or more processors. The processor executable program instructions, when executed by the one or more processors, may cause the one or more processors to perform various operations.

In various embodiments, the computer system may include Internet of Things (IoT) devices. IoT devices may include objects embedded with electronics, software, sensors, actuators, and network connectivity which enable these objects to collect and exchange data. IoT devices may be in-use with wired or wireless devices by sending data through an interface to another device. IoT devices may collect useful data and then autonomously flow the data between other devices.

Various examples of modules may be implemented using circuitry, including various electronic hardware. By way of example and not limitation, the hardware may include transistors, resistors, capacitors, switches, integrated circuits and/or other modules. In various examples, the modules may include analog and/or digital logic, discrete components, traces and/or memory circuits fabricated on a silicon substrate including various integrated circuits (e.g., FPGAs, ASICs). In some embodiments, the module(s) may involve execution of preprogrammed instructions and/or software executed by a processor. For example, various modules may involve both hardware and software.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. An electrical circuit, comprising:
a low-pass filter (LPF) receiving an output clock signal from a logic circuit;
an amplifier configured to generate a first analog signal in response to an analog command signal and an output signal from the LPF;
a loop filter configured to generate a second analog signal in response to the first analog signal from the amplifier; and, a reset logic circuit, in response to an external reset signal and an output $VCDL_{out}$ signal of a voltage controlled delay line VCDL, configured to generate a final reset signal to reset the logic circuit, wherein, the VCDL is configured to generate the $VCDL_{out}$ signal in response to the second analog signal and a digital command signal.

2. The electrical circuit of claim 1, wherein, after resetting the logic circuit, a duty cycle of the output clock signal becomes about 50%.

3. The electrical circuit of claim 1, wherein the VCDL is configured to select a delay range in response to a digital command signal.

4. The electrical circuit of claim 3, wherein the VCDL is further configured to adjust an amount of delay to correct a duty cycle error of the output clock signal in response to the analog command signal.

5. The electrical circuit of claim 1, wherein the VCDL further comprises a plurality of cascaded stages, each of the plurality of cascaded stages comprising a plurality of delay buffers.

6. The electrical circuit of claim 5, wherein each of the plurality of delay buffers further comprises:
- a PMOS transistor and a NMOS transistor arranged as a CMOS inverter;
- an NMOS transistor electrically connected with the NMOS transistor in series; and,
- a plurality of digital controlled delay bands coupled to an output of the CMOS inverter,
- wherein the NMOS transistor is configured to present a controllable resistance in response to the second analog signal.

7. The electrical circuit of claim 6, wherein each of the plurality of delay buffers further comprises an NMOS transistor in parallel with the NMOS transistor, and the NMOS transistor is coupled to a high input voltage $V_{dd}$.

8. The electrical circuit of claim 6, wherein each of the plurality of digital controlled delay bands comprises a plurality of slices configured in parallel, wherein each of the plurality of slices is configured to be selectively enabled in response to the digital command signal.

9. The electrical circuit of claim 1, wherein the reset logic comprises:
- at least one inverter configured to invert and delay the $VCDL_{out}$ signal;
- a first NAND gate configured to generate an internal reset signal in response to the $VCDL_{out}$ signal and the inverted and delayed $VCDL_{out}$ γ signal;
- a second inverter configured to invert the external reset signal; and,
- a second NAND gate configured to generate the final reset signal in response to the internal reset signal and the inverted external reset signal.

10. The electrical circuit of claim 1, wherein the logic circuit comprises a D-type flip flop, and the amplifier comprises an operational transconductance amplifier OTA.

11. A method to correct duty cycle error, comprising:
- sending an output clock signal from a logic circuit to a low-pass filter (LPF) and a voltage-controlled delay line (VCDL);
- generating a first analog signal in response to an analog command signal and an output signal from the LPF;
- transferring the first analog signal into a second analog signal through a loop filter;
- generating an output $VCDL_{out}$ signal by the VCDL in response to the second analog signal and a digital command signal;
- generating a final reset signal resetting the logic circuit in response to an external reset signal and the $VCDL_{out}$ signal.

12. The method of claim 11, wherein, after resetting the logic circuit, a duty cycle of the output clock signal becomes about 50%.

13. The method of claim 11, wherein the VCDL is configured to select a delay range in response to a digital command signal.

14. The method of claim 13, wherein the VCDL is further configured to adjust an amount of delay to correct a duty cycle error of the output clock signal in response to the analog command signal.

15. The method of claim 11, wherein the VCDL further comprises a plurality of cascaded stages, each of the plurality of cascaded stages comprising a plurality of delay buffers.

16. The method of claim 15, wherein each of the plurality of delay buffers further comprises:
- a PMOS transistor and an NMOS transistor arranged as a CMOS inverter;
- an NMOS transistor connected with the NMOS transistor in series; and,
- a plurality of digital controlled delay bands coupled to an output of the CMOS inverter,
- wherein the NMOS transistor is configured to present a controllable resistance in response to the second analog signal.

17. The method of claim 16, wherein each of the plurality of delay buffers further comprises an NMOS transistor in parallel with the NMOS transistor, and the NMOS transistor is coupled to a high input voltage $V_{dd}$.

18. The method of claim 16, wherein each of the plurality of digital controlled delay bands comprises a plurality of slices configured in parallel, wherein each of the plurality of slices is configured to be selectively enabled in response to the digital command signal.

19. The method of claim 11, wherein the final reset signal is generated by a reset logic circuit, the reset logic circuit comprises:
- an inverter configured to invert the $VCDL_{out}$ signal;
- a first NAND gate is configured to generate an output signal in response to the $VCDL_{out}$ signal and the inverted $VCDL_{out}$ signal;
- a second inverter configured to generate the external reset signal; and,
- a second NAND gate configured to generate the reset final signal in response to the first NAND gate output signal and the inverted external reset signal.

20. The method of claim 11, wherein the logic circuit comprises a D-type flip flop.

* * * * *